(12) United States Patent
Buckfeller

(10) Patent No.: US 6,387,817 B1
(45) Date of Patent: May 14, 2002

(54) PLASMA CONFINEMENT SHIELD

(75) Inventor: Joseph W. Buckfeller, Orlando, FL (US)

(73) Assignee: Agere Systems Guardian Corp., Berkeley, NJ (US)

( * ) Notice: Subject to any disclaimer, the term of this patent is extended or adjusted under 35 U.S.C. 154(b) by 0 days.

(21) Appl. No.: 09/390,181

(22) Filed: Sep. 7, 1999

(51) Int. Cl.[7] ............................................ H01L 21/3065
(52) U.S. Cl. ........................ 438/712; 438/714; 438/729; 438/731
(58) Field of Search ................................. 438/706, 712, 438/714, 731, 729; 156/345

(56) References Cited

U.S. PATENT DOCUMENTS 6,059,945 A * 5/2000 Fu et al. ................ 204/298.12
6,074,518 A * 6/2000 Imafuku et al. ............ 156/345
6,149,506 A * 11/2000 Duescher ..................... 451/59

FOREIGN PATENT DOCUMENTS

EP          533438 A2 * 3/1993 ........... C23C/16/44

* cited by examiner

Primary Examiner—Benjamin L. Utech
Assistant Examiner—Binh X. Tran
(74) Attorney, Agent, or Firm—Stroock & Stroock & Lavan LLP

(57) ABSTRACT

Improvements of the shielding of the reactor chamber in a radio frequency (RF) reactor are realized by providing dressed edges on the apertures found in the shield. These improvements to the reactor chamber lead to decreased defect density on processed wafers and eliminate the need for frequent cleaning of the reactor chamber.

4 Claims, 3 Drawing Sheets

PLASMA CONFINEMENT SHIELD

FIELD OF THE INVENTION

This invention relates to the field of radio frequency (RF) plasma reactors used in processing integrated circuits, and specifically to improvements of the shielding of the reactor chamber for decreasing the defect density of processed wafers and eliminating the need for frequent cleaning of the reactor chamber.

BACKGROUND OF THE INVENTION

Semiconductor microchips and integrated circuits have become a necessity in today's technological society. As the technology advances, the demand for smaller, more reliable, and efficiently manufactured integrated circuits increases. Currently, several processes are available to manufacture integrated circuits, including metal etching, chemical vapor deposition (CVD), and physical vapor deposition (PVD), as some examples. RF plasma reactors, for instance, are presently employed in such processes. An example of such a reactor is the Novellus A2 Etch Module manufactured and sold by Novellus Systems, Inc. of San Jose, Calif.

Generally, an RF plasma reactor consists of a reactor chamber, which includes a plasma confinement shield and an anode shield to concentrate the plasma on the wafer. The shielding is provided with cylindrically-shaped apertures having sharp edges through which a gas is directed into the space within the shields for ionization. The reactor chamber also includes an RF power source for igniting and sustaining the plasma and a cryo-pump for creating a vacuum and for maintaining a constant negative pressure and flow of gas within the chamber. Depending upon the particular application, the plasma may be used, for example, in a PVD process to deposit conductive material on the wafer or to plasma etch or clean the wafer.

One such example of plasma etching is the removal of a native oxide layer naturally found on the surface of the wafer. Generally, plasma etching is performed prior to the PVD process, because removal of the oxide layer creates improved chemical and mechanical bonding of the conductive material to the wafer surface. During the etch process, ionized gas particles are accelerated towards the wafer, impacting and dislodging the oxide particles from the wafer surface. These dislodged oxide particles are attracted by and adhere to the plasma confinement and anode shields. As oxide particles accumulate a film is created.

High stress areas develop in the oxide film around the sharp edges of the shield apertures. These high stress areas can cause the oxide film to peel off causing an increased particle count in the space within the shields. Since these particles can rain down on the wafers during subsequent processing of the wafers, the defect density is increased. This may result in circuit malfunction, unreliability, and the like. Thus, the shielding must be cleaned frequently, thereby slowing the manufacturing process and increasing the cost of the end product. In addition, the cylindrical shape of the holes tends to produce a directional gas flow in the space within the shields, which decreases the efficiency of gas ionization. Poor gas ionization produces lower etch rates which further slows the manufacturing process of integrated circuits.

SUMMARY OF THE INVENTION

The present invention is directed at overcoming shortcomings in the prior art. The invention comprises a plasma confinement shield and a disk-shaped anode shield having a plurality of apertures having smooth dressed edges for eliminating potential high stress areas and improving gas flow within the reactor chamber. A "dressed edge", as that term is used herein, is a substantially smooth edge which does not consist of a right angular mating of straight surfaces, so as to avoid the sharp edges that cause the high stress locations on the oxide film, such as an edge that is preferably rounded, curved, or beveled. The invention also comprises a method of cleaning the shielding with a carbon dioxide blast for decreasing the particle density encountered within the reactor chamber during processing.

Prior to deployment in the reactor, the shielding of the present invention is blasted with pressurized carbon dioxide which mechanically cleans the shielding. The cleaning process ensures that any particles present on the shield surface are removed prior to processing. During the etching process, the dressed edges of the apertures reduce or eliminate the potential for locations of high stress on the oxide film. This decreases the likelihood that film will peel off, rain down on the wafer, and cause defects, thus increasing the reliability of the integrated circuit manufacturing process is increased.

In addition, the dressed edge of the apertures causes the injected gas to enter the space within the shields in a more widely dispersed pattern than that obtained through a prior art cylindrical aperture without a dressed edge. This leads to more widely dispersed gas flow in the space within the shields, which increases gas ionization. Increased gas ionization generates higher etch rates and further improves manufacturing efficiency.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Figure 1:
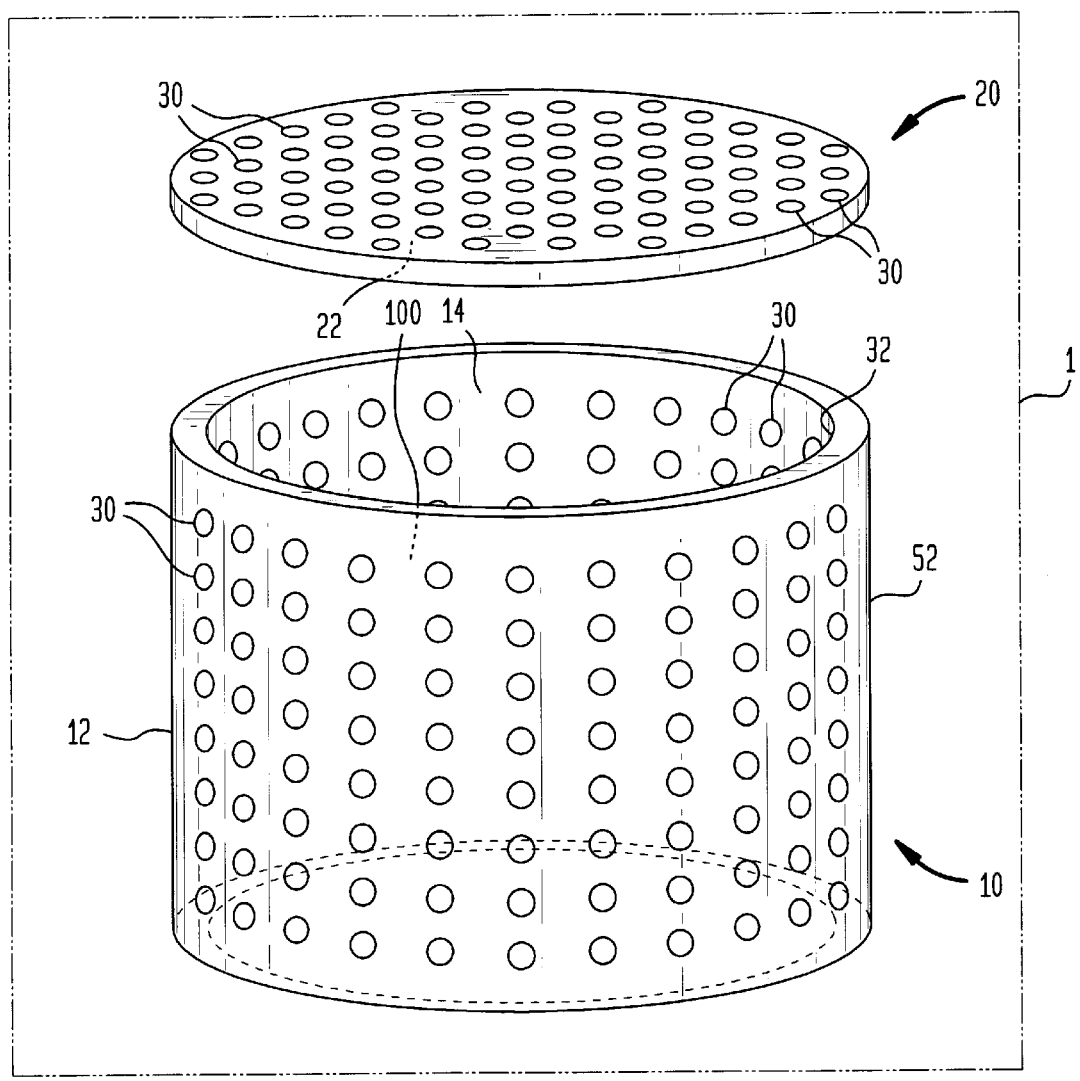
FIG. 1 is a perspective view of a plasma confinement shield and an anode shield in accordance with the present invention.
Figure 2:
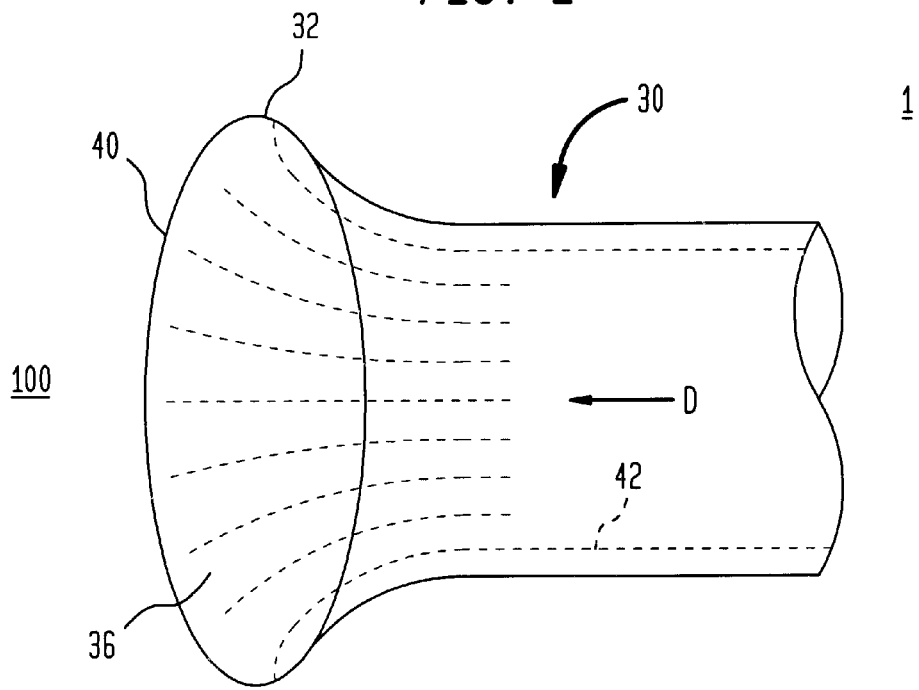
FIG. 2 is a partial perspective schematic view of an aperture in accordance with the present invention.
Figure 3:
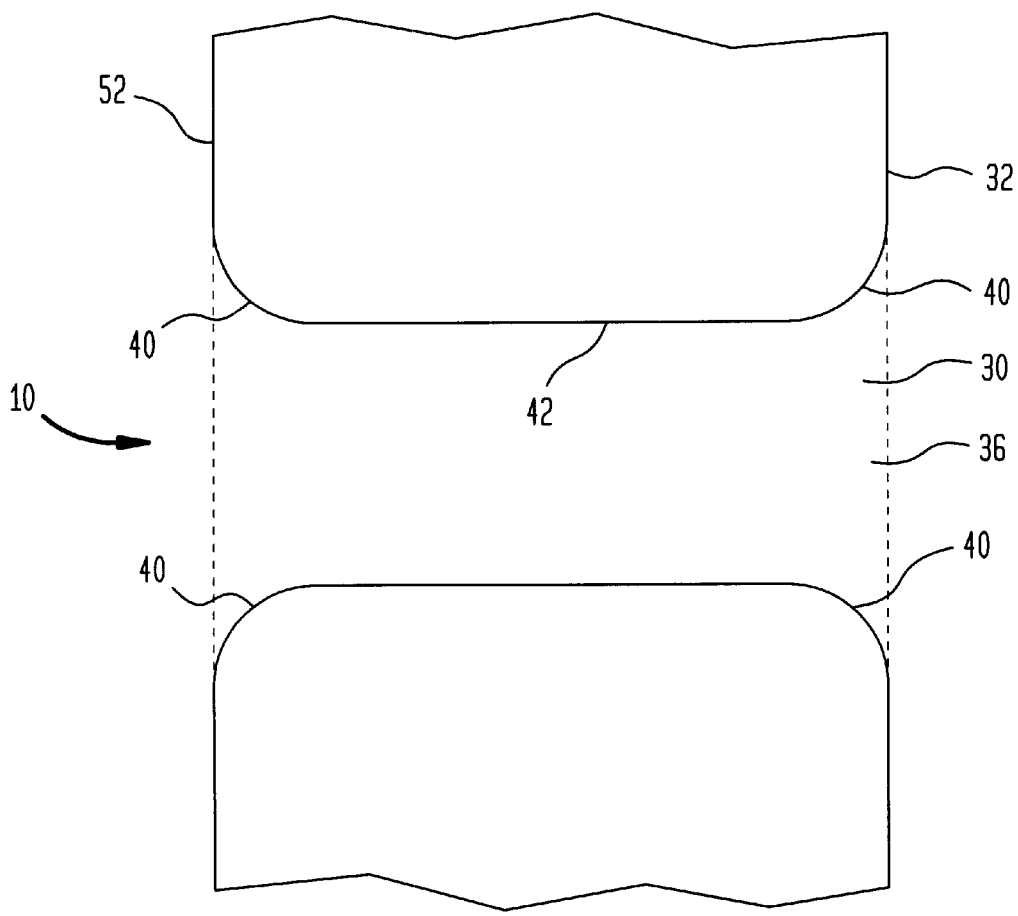
FIG. 3 is a sectional view of an aperture in accordance with the present invention.

With reference to FIGS. 1–3, there is shown a plasma confinement shield 10 and an anode shield 20 having a plurality of apertures 30 constructed in accordance with the present invention. Apertures 30 are provided with dressed edges 40, discussed further below.

Referring now to FIG. 1, there is shown a plasma confinement shield 10 and anode shield 20, suitable for deployment in a reactor chamber 1. One skilled in the art will recognize that the reactor chamber may be any type of reactor chamber known in the art utilizing shielding of the same or similar type to that shown and described herein. Plasma confinement shield 10 and anode shield 20 are preferably constructed from a process resistant metal, such as, for example, stainless steel.

Referring again to FIGS. 1 and 3, plasma confinement shield 10 has a generally cylindrical shape, having a side wall 12 forming a space 100 within the shield, and an open end 14. Anode shield 20 is generally disk-shaped and is mountable upon open end 14 of plasma confinement shield 10, so as to form a cover enclosing space 100. Side wall 12 of plasma confinement shield 10 and anode shield 20 include a plurality of apertures 30 through which a gas (not shown) may be injected into the space within the shields in a manner known in the art. In a preferred embodiment, apertures 30 have an inner diameter of three-sixteenths of an inch and a depth, from interior wall 32 to exterior wall 52, of one-eighth of an inch. Plasma confinement shield 10 and anode shield 20 are disposed in a reactor chamber in a manner known in the art for processing therein a substrate.

Referring now to FIGS. 2 and 3, aperture 30 is provided with dressed edge 40. Dressed edge 40 provides a smooth transition from the inner diameter of wall 42 to the diameter of inner wall opening 36, thereby eliminating the high stress areas formed on prior art apertures having sharp edges. Further, in a preferred embodiment, dressed edge 40 is smooth and level with interior wall 32 of plasma confinement shield 10 or interior wall 22 of anode shield 20. As such, any potential high stress areas are further eliminated. In a preferred embodiment, dressed edge 40 is a radiused edge having a radius of 0.060 inches, although the exact cross sectional shape and size of dressed edge 40 is an application specific matter of design choice, provided of course, in accordance with the teachings herein, that sharp edges are eliminated. Thus, the cross sectional shape of dressed edge 40 may be radiused, curved, parabolic, chamfered, bullnosed, or some combination thereof. One skilled in the art will recognize that dressed edge 40 may be formed by any methods known in the art, such as, for example by machining. Preferably, both the entrance and exit sides of aperture 30 are dressed, that is, the edges formed at exterior wall 52 and interior wall 32, although it is possible to dress only the edge at interior wall 32.

Referring again to FIGS. 1 and 2, dressed edge 40 creates a funnel-type shape leading inward from reactor chamber 1 to the interior of the shield 10 along direction D. Thus, a gas that is injected into the space 100 within the shields will be forced outward toward the dressed edge 40 causing the gas to have a more widely dispersed gas flow pattern. This dispersed flow results in increased particle collisions, thereby improving gas ionization.

Figure 4:
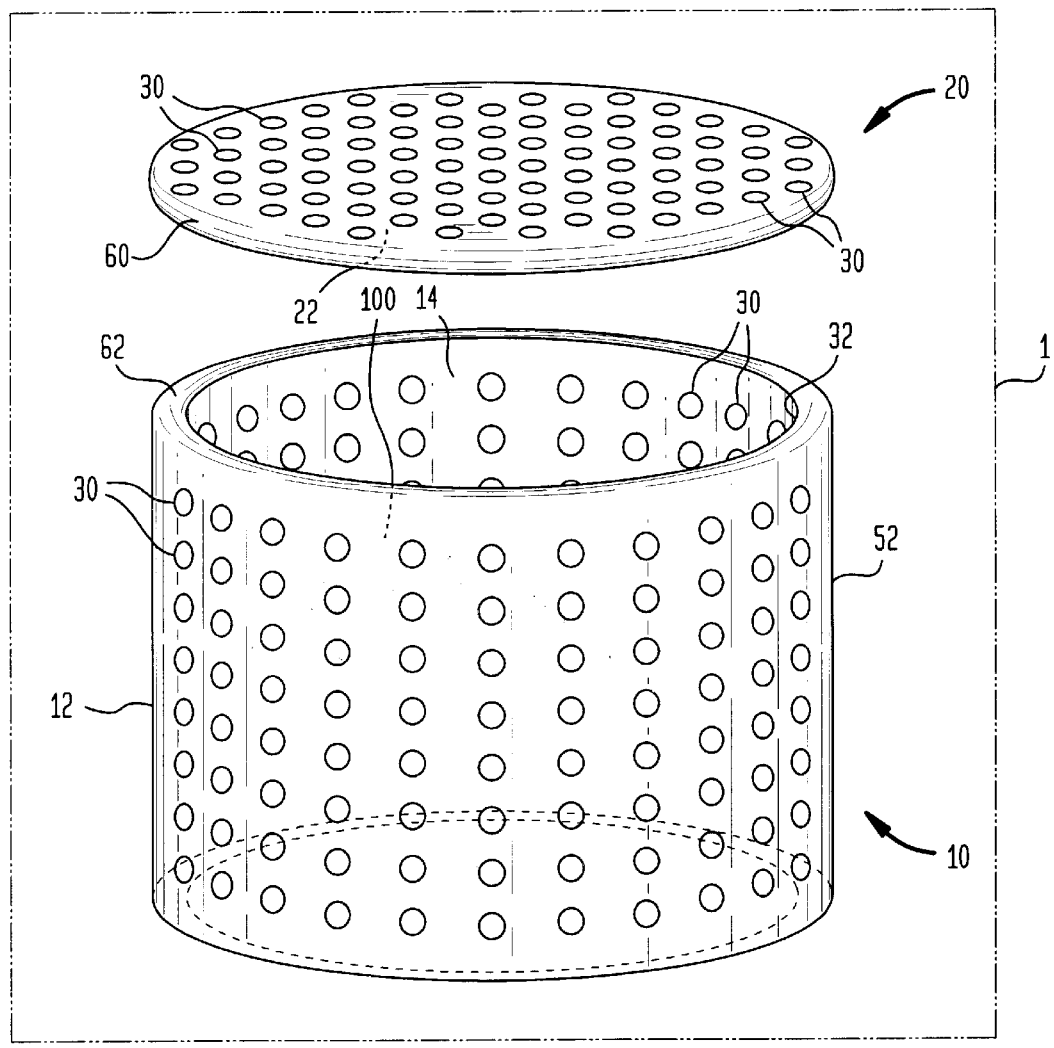
FIG. 4 is a perspective view of a plasma confinement shield and an anode shield, both with dressed edges.

With reference to FIG. 4, there is shown an alternate embodiment of a plasma confinement shield 10, possessing a side wall 12 with a dressed top edge 62. Also shown is an anode shield 20, with an outer perimeter edge 60, which is dressed. As discussed above, with respect to the dressed edges of the apertures, the dressed edges of the side wall of the plasma confinement shield and the anode shield also reduce or possibly eliminate high stress areas.

A preferred embodiment of a process for cleaning plasma confinement shield 10 and anode shield 20 prior to deployment within reactor chamber 1 includes a process whereby a gas cylinder containing carbon dioxide gas is pressurized to, by way of non-limiting example, 2,000 psi. The gas cylinder is fluidly connected to a delivery gun for directing the $CO_2$ gas at the shields. For example, an operator directs the delivery gun at the shielding to be cleaned. Preferably, the gas is applied to the shielding in a circular motion. However, one skilled in the art will recognize that this process may be performed, for instance, by a machine adapted for such usage.

Next, as the $CO_2$ is delivered from the delivery gun, the $CO_2$ crystallizes. Upon impact with the shielding, the $CO_2$ crystals sublimate and force mechanically adhered material off the surface of the shielding. Thus, the cleaning process is accomplished in a non-abrasive manner and the shielding in prepared for use within the reactor chamber.

Thus, will there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of processing a substrate, comprising the steps of:

mechanically cleaning a plasma confinement shield and an anode shield with a blast of carbon dioxide, said shields having a plurality of apertures having dressed edges and forming a space for receiving a substrate;

disposing said shields in a chamber;

placing said substrate within said space;

sealing said chamber;

pressurizing said chamber;

delivering a gas to said chamber; and exciting said gas into a plasma state by applying a radio frequency power source to said gas.

2. A method of cleaning a plasma reactor, comprising the steps of:

providing a delivery gun in fluid communication with a gas container, said gas container containing a pressurized gas, causing said delivery gun to expel said gas uniformly; and applying said expelled gas to a shield having a plurality of apertures having dressed edges for removing mechanically adhered particles from said shield.

3. A method of etching a semiconductor, comprising the steps of:

mechanically cleaning a plasma confinement shield and an anode shield with a blast of carbon dioxide, said shields having a plurality of apertures having dressed edges and forming a space for receiving a substrate;

disposing said shields in a chamber;

placing said semiconductor within said space and sealing said chamber;

pressurizing said chamber;

delivering a gas to said chamber; and exciting said gas into a plasma state by applying a radio frequency power source to said gas.

4. A method of processing a substrate, comprising the steps of:

placing a substrate in a space formed within a plasma confinement shield and an anode shield, said shields being disposed in a reactor chamber and having a plurality of apertures having a dressed edge;

pressurizing said chamber;

delivering a gas to said chamber; and exciting said gas into a plasma state.

* * * * *